United States Patent
Usui et al.

(10) Patent No.: US 7,224,038 B2
(45) Date of Patent: May 29, 2007

(54) SEMICONDUCTOR DEVICE HAVING ELEMENT ISOLATION TRENCH AND METHOD OF FABRICATING THE SAME

(75) Inventors: Ryosuke Usui, Ichinomiya (JP); Tatsuya Fujishima, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/985,743

(22) Filed: Nov. 6, 2001

(65) Prior Publication Data

US 2002/0056886 A1    May 16, 2002

(30) Foreign Application Priority Data

Nov. 13, 2000    (JP)    ............... 2000-344754

(51) Int. Cl.
    *H01L 21/76*    (2006.01)
(52) U.S. Cl. .............. 257/510; 257/506; 257/524; 257/E21.546
(58) Field of Classification Search .............. 257/506, 257/501, 510, 524, E21.546, E21.55; 438/423–428, 438/438
    See application file for complete search history.

(56) References Cited

U.S. PATENT DOCUMENTS

| | | | | |
|---|---|---|---|---|
| 4,472,240 | A | * | 9/1984 | Kameyama ............. 438/427 |
| 4,533,430 | A | * | 8/1985 | Bower .................... 438/695 |
| 5,128,743 | A | * | 7/1992 | Tamaki et al. .......... 257/513 |
| 5,223,447 | A | * | 6/1993 | Lee et al. ............... 438/247 |
| 5,358,891 | A | * | 10/1994 | Tsang et al. ............ 438/426 |
| 5,910,018 | A | * | 6/1999 | Jang ....................... 438/425 |
| 6,140,242 | A | * | 10/2000 | Oh et al. ................ 438/698 |

(Continued)

FOREIGN PATENT DOCUMENTS

JP    59-056740    4/1984

(Continued)

*Primary Examiner*—Eugene Lee
(74) *Attorney, Agent, or Firm*—McDermott Will & Emery LLP

(57) ABSTRACT

A semiconductor device capable of preventing defective embedding of an insulator and improving the withstand voltage (dielectric strength) of an element isolation region is obtained. This semiconductor device comprises a semiconductor substrate having a main surface and an element isolation trench formed on the main surface of the semiconductor device, while the trench width of an upper end of the element isolation trench is larger than the trench width of a bottom surface and the length of a side surface located between the upper end and an end of the bottom surface is larger than the length of a straight line connecting the upper end and the end of the bottom surface. Thus, the element isolation trench is so formed that the trench width of the upper end is larger than the trench width of the bottom surface, whereby an insulator can be readily embedded in the element isolation trench. Thus, the insulator can be prevented from defective embedding. Further, the element isolation trench is so formed that the length of the side surface located between the upper end and the end of the bottom surface is larger than the length of the straight line connecting the upper end and the end of the bottom surface, thereby improving the withstand voltage of the element isolation region as compared with a case of forming the side surface located between the upper end and the end of the bottom surface in a tapered manner.

4 Claims, 5 Drawing Sheets

U.S. PATENT DOCUMENTS

| | | | |
|---|---|---|---|
| 6,156,620 A * | 12/2000 | Puchner et al. | 438/400 |
| 6,207,532 B1 * | 3/2001 | Lin et al. | 438/424 |
| 6,242,788 B1 * | 6/2001 | Mizuo | 257/506 |
| 6,251,734 B1 * | 6/2001 | Grivna et al. | 438/296 |
| 6,274,457 B1 * | 8/2001 | Sakai et al. | 438/424 |
| 6,365,952 B1 * | 4/2002 | Akram | 257/510 |
| 6,387,776 B1 * | 5/2002 | Yi et al. | 438/435 |
| 6,461,934 B2 * | 10/2002 | Nishida et al. | 438/424 |
| 6,624,496 B2 * | 9/2003 | Ku et al. | 257/510 |
| 6,723,615 B2 * | 4/2004 | Shimizu | 438/424 |
| 6,849,919 B2 * | 2/2005 | Sumino et al. | 257/510 |
| 2003/0197241 A1 * | 10/2003 | Choi et al. | 257/506 |
| 2005/0093080 A1 * | 5/2005 | Kitamura et al. | 257/390 |

FOREIGN PATENT DOCUMENTS

| | | |
|---|---|---|
| JP | 61-150230 | 7/1986 |
| JP | 62252139 A * | 11/1987 |
| JP | 02-260424 | 10/1990 |
| JP | 05-074929 | 3/1993 |
| JP | 09074132 A * | 3/1997 |
| JP | 09-289313 | 11/1997 |
| JP | 10-012600 | 1/1998 |
| JP | 2002237540 A | 8/2002 |

* cited by examiner

SEMICONDUCTOR DEVICE HAVING ELEMENT ISOLATION TRENCH AND METHOD OF FABRICATING THE SAME

BACKGROUND OF THE INVENTION

1. Field of the Invention

The present invention relates to a semiconductor device and a method of fabricating the same, and more specifically, it relates to a semiconductor device having an element isolation trench and a method of fabricating the same.

2. Description of the Prior Art

As the degree of integration of a semiconductor device is improved, a technique of finely working the semiconductor device is recently becoming increasingly important. Such fine working includes element isolation for isolating semiconductor elements forming the semiconductor device from each other. Following the improvement of the degree of integration of the semiconductor device, a technique referred to as trench isolation is increasingly employed for the element isolation.

This trench isolation is performed by forming an element isolation trench in a semiconductor device and embedding an insulator or the like in the formed trench. The insulator or the like embedded in the trench isolates element regions located on both sides of the trench from each other.

When a conventional trench is formed to have side surfaces perpendicular to the main surface of the semiconductor substrate, however, it is difficult to excellently embed an insulator in the trench. Therefore, the insulator may be defectively embedded in the trench. Consequently, the element isolation region cannot be properly formed.

In order to avoid the aforementioned problem of defective embedding, a technique of forming the trench in a tapered manner is proposed. When the trench formed in a tapered manner is provided with the same opening width as a perpendicularly formed trench, however, the withstand voltage (dielectric strength) of the trench is disadvantageously reduced. In order to increase the withstand voltage of the trench, the depth of the trench may be increased. When the trench is formed in a tapered manner, however, the depth of the trench is limited.

When the opening width of the trench is increased for overcoming the problem of limitation of the depth resulting from the tapered shape, refinement (improvement of the degree of integration) of the semiconductor device is disadvantageously hindered.

SUMMARY OF THE INVENTION

An object of the present invention is to provide a semiconductor device capable of preventing defective embedding of an insulator and improving the withstand voltage (dielectric strength) of an element isolation region.

Another object of the present invention is to provide a method of fabricating a semiconductor device capable of readily forming a semiconductor device capable of preventing defective embedding of an insulator and improving the withstand voltage (dielectric strength) of an element isolation region.

Still another object of the present invention is to simplify a fabrication process in the aforementioned method of fabricating a semiconductor device.

A semiconductor device according to a first aspect of the present invention comprises a semiconductor substrate having a main surface and an element isolation trench formed on the main surface of the semiconductor substrate, while the trench width of an upper end of the element isolation trench is larger than the trench width of a bottom surface and the length of a side surface located between the upper end and an end of the bottom surface is larger than the length of a straight line connecting the upper end and the end of the bottom surface.

In the semiconductor device according to the first aspect, the element isolation trench is so formed that the trench width of the upper end is larger than the trench width of the bottom surface as described above, so that an insulator can be readily embedded in the element isolation trench. Thus, the insulator can be prevented from defective embedding. Further, the element isolation trench is so formed that the length of the side surface located between the upper end and the end of the bottom surface is larger than the length of the straight line connecting the upper end and the end of the bottom surface, thereby improving the withstand voltage (dielectric strength) of the element isolation region as compared with a case of forming the side surface located between the upper end and the end of the bottom surface in a tapered manner. Thus, an element isolation trench having an excellent element isolation characteristic can be formed. Further, the withstand voltage of an element isolation region including the element isolation trench can be readily adjusted by adjusting the depth of the element isolation trench. In this case, the opening width of the element isolation trench may not be changed and hence a mask employed for forming the element isolation trench may not be changed either. Consequently, no cost is required for changing design of the withstand voltage.

In the semiconductor device according to the aforementioned first aspect, the section of at least a central portion of the side surface of the element isolation trench exhibits a curved shape having an angle of inclination gradually steepened toward a downward direction perpendicular to the main surface of the semiconductor substrate. According to this structure, the element isolation trench can be readily so formed that the length of the side surface located between the upper end and the end of the bottom surface is larger than the length of the straight line connecting the upper end and the end of the bottom surface. In this case, the section of the side surface of the element isolation trench substantially has an S shape. The section of a part of the side surface of the element isolation trench close to the upper end may be formed to be substantially perpendicular to the main surface of the semiconductor substrate. Further, the section of a part of the side surface of the element isolation trench close to the bottom surface may be formed to be substantially perpendicular to the main surface of the semiconductor substrate.

In the semiconductor device according to the aforementioned first aspect, the side surface of the element isolation trench preferably includes a first side surface located in the vicinity of the upper end of the element isolation trench and formed to be substantially perpendicular to the main surface of the semiconductor substrate, a second side surface located in the vicinity of the bottom surface of the element isolation trench and formed to be substantially perpendicular to the main surface of the semiconductor substrate and a substantially linearly inclined third side surface connecting the first side surface and the second side surface with each other. According to this structure, the element isolation trench can be readily so formed that the length of the side surface located between the upper end and the end of the bottom surface is larger than the length of the straight line connecting the upper end and the end of the bottom surface.

In the semiconductor device according to the aforementioned first aspect, an insulator is preferably embedded in the element isolation trench. According to this structure, an element isolation region consisting of the element isolation trench and an insulator film can be readily formed.

A method of fabricating a semiconductor device according to a second aspect of the present invention comprises steps of forming an etching mask on a prescribed region of a main surface of a semiconductor substrate and forming an element isolation trench by etching the semiconductor substrate through the etching mask, while the step of forming the element isolation trench includes a step of forming the element isolation trench under an etching condition more readily forming a sidewall protective film in an opening of the semiconductor substrate than an etching condition for forming an element isolation trench having a side surface substantially perpendicular to the main surface of the semiconductor substrate and under such an etching condition that etching gas self-controllably reduces a reduction ratio of the trench width due to reduction of an etching area following reduction of the trench width when performing etching to gradually reduce the width of the element isolation trench.

In the method of fabricating a semiconductor device according to the second aspect, such an etching condition that the etching gas self-controllably reduces the reduction ratio of the trench width due to reduction of the etching area following reduction of the trench width is employed as described above, whereby the element isolation trench can be formed in a desired shape without artificially changing the etching condition. Thus, the fabrication process can be simplified. When the element isolation trench is so formed that the trench width of an upper end is larger than the trench width of a bottom surface, an insulator can be readily embedded in the element isolation trench. Thus, the insulator can be prevented from defective embedding. Further, when the element isolation trench is so formed that the length of a side surface located between the upper end and an end of the bottom surface is larger than the length of a straight line connecting the upper end and the end of the bottom surface, the withstand voltage of the element isolation region can be more improved as compared with a case of forming the side surface located between the upper end and the end of the bottom surface in a tapered manner. Thus, an element isolation trench having an excellent element isolation characteristic can be formed.

The method of fabricating a semiconductor device according to the aforementioned second aspect preferably further comprises steps of forming a silicon oxide film on the main surface of the semiconductor substrate and thereafter forming a silicon nitride film for defining the etching mask on the silicon oxide film, anisotropically etching prescribed regions of the silicon nitride film and the silicon oxide film thereby patterning the silicon nitride film and the silicon oxide film, and also anisotropically etching a surface of the semiconductor substrate when anisotropically etching the prescribed regions of the silicon nitride film and the silicon oxide film thereby forming an opening having a side surface substantially perpendicular to the main surface of the semiconductor substrate in advance of the step of forming the element isolation trench. According to this structure, the semiconductor substrate is substantially perpendicularly etched to follow the shape the opening in etching for forming the element isolation trench. The trench width is gradually reduced as the trench formed by etching is deepened.

In the method of fabricating a semiconductor device according to the aforementioned second aspect, the section of at least a central portion of the side surface of the element isolation trench is preferably formed to exhibit a curved shape having an angle of inclination gradually steepened toward a downward direction perpendicular to the main surface of the semiconductor substrate. According to this structure, the element isolation trench can be readily so formed that the length of the side surface located between the upper end and the end of the bottom surface is larger than the length of the straight line connecting the upper end and the end of the bottom surface. In this case, the section of the side surface of the element isolation trench may be formed to substantially have an S shape. Further, the section of a part of the side surface of the element isolation trench close to the upper end may be formed to be substantially perpendicular to the main surface of the semiconductor substrate. In addition, the section of a part of the side surface of the element isolation trench close to the bottom surface may be formed to be substantially perpendicular to the main surface of the semiconductor substrate.

The method of fabricating a semiconductor device according to the aforementioned second aspect preferably further comprises a step of embedding an insulator in the element isolation trench. According to this structure, an element isolation region consisting of the element isolation trench and an insulator film can be readily formed.

A method of fabricating a semiconductor device according to a third aspect of the present invention comprises steps of forming an etching mask on a prescribed region of a main surface of a semiconductor substrate, forming a first side surface substantially perpendicular to the main surface of the semiconductor substrate by anisotropically etching the semiconductor substrate through the etching mask, thereafter switching an etching condition to an etching condition more readily forming a sidewall protective film in an opening of the semiconductor substrate for etching the semiconductor substrate thereby forming a second side surface, and thereafter switching the etching condition to an anisotropic etching condition for anisotropically etching the semiconductor substrate thereby forming a third side surface substantially perpendicular to the main surface of the semiconductor substrate.

In the method of fabricating a semiconductor device according to the third aspect, the etching condition is switched as described above for forming the element isolation trench so that the trench width of an upper end is larger than the trench width of a bottom surface and the length of a side surface located between the upper end and an end of the bottom surface is larger than the length of a straight line connecting the upper end and the end of the bottom surface. When the element isolation trench is so formed that the trench width of the upper end is larger than the trench width of the bottom surface, an insulator can be readily embedded in the element isolation trench. Thus, the insulator can be prevented from defective embedding. Further, when the element isolation trench is so formed that the length of the side surface located between the upper end and the end of the bottom surface is larger than the length of the straight line connecting the upper end and the end of the bottom surface, the withstand voltage of the element isolation region can be more improved as compared with a case of forming the side surface located between the upper end and the end of the bottom surface in a tapered manner. Thus, an element isolation trench having an excellent element isolation characteristic can be formed.

The method of fabricating a semiconductor device according to the aforementioned third aspect preferably further comprises steps of forming a silicon oxide film on the main surface of the semiconductor substrate and thereafter forming a silicon nitride film for defining the etching mask on the silicon oxide film, anisotropically etching prescribed regions of the silicon nitride film and the silicon oxide film thereby patterning the silicon nitride film and the silicon oxide film, and also anisotropically etching a surface of the semiconductor substrate when anisotropically etching the prescribed regions of the silicon nitride film and the silicon oxide film thereby forming an opening having a side surface substantially perpendicular to the main surface of the semiconductor substrate in advance of the step of forming the element isolation trench. According to this structure, the semiconductor substrate is substantially perpendicularly etched to follow the shape of the opening in etching for forming the element isolation trench. The element isolation trench can be formed in a desired shape by switching the etching condition.

The method of fabricating a semiconductor device according to the aforementioned third aspect preferably further comprises a step of embedding an insulator in the element isolation trench. According to this structure, an element isolation region consisting of the element isolation trench and an insulator film can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
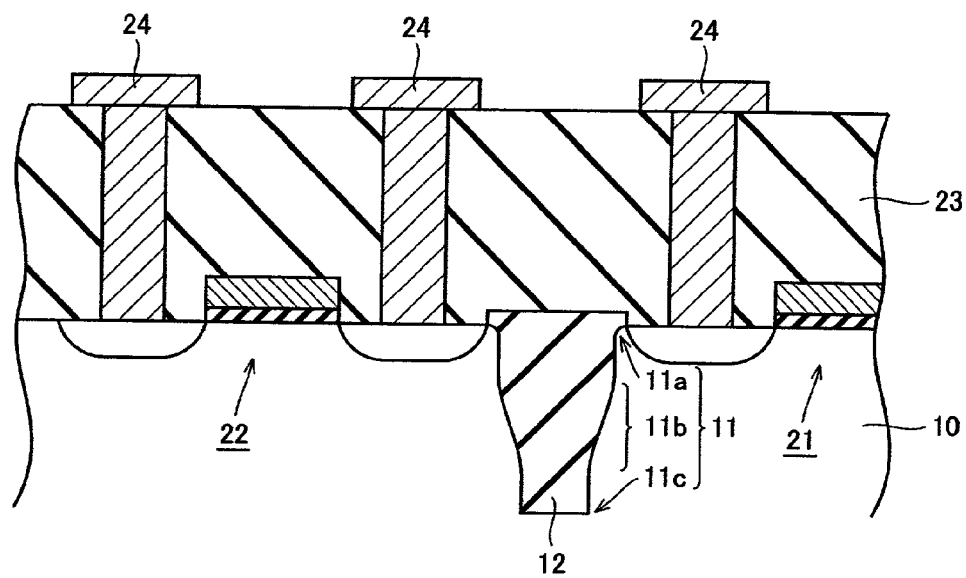
FIG. 1 is a sectional view showing a semiconductor device according to a first embodiment of the present invention.

Embodiments of the present invention are now described with reference to the drawings.

(First Embodiment)

The structure of a semiconductor device according to a first embodiment of the present invention is now described with reference to FIG. 1. In the semiconductor device according to the first embodiment, element regions 21 and 22 are formed on a main surface of a semiconductor substrate 10. A trench 11 is formed to isolate the element regions 21 and 22 from each other. An insulator 12 is embedded in the trench 11. The trench 11 is an example of the "element isolation trench" according to the present invention. The trench 11 and the insulator 12 form an element isolation region.

An interlayer dielectric film 23 and wiring layers 24 are arranged on the element regions 21 and 22 and the element isolation region.

The first embodiment requires a withstand voltage (dielectric strength) of 2.5 V to the element isolation region, and hence the depth of the trench 11 is preferably set to 300 nm to 400 nm. According to the first embodiment, the depth of the trench 11 is set to 350 nm.

According to the first embodiment, the trench 11 is so formed that the trench width of an upper end 11a is larger than the trench width of a bottom surface 11c. Further, the trench 11 is so formed that the length of a line (side surface) connecting the upper end 11a and an end of the bottom surface 11c with each other in the section along a direction perpendicular to the main surface of the semiconductor substrate 10 is larger than the length of the shortest straight line connecting the upper end 11a and the bottom surface 11c with each other. In other words, the trench 11 has a curved side surface 11b, for smoothly connecting the upper end 11a and the bottom surface 11c with each other.

Particularly in the first embodiment, the side surface 11b exhibits a curved shape having an angle of inclination gradually steepened downward along the direction perpendicular to the main surface of the semiconductor substrate 10. In other words, the side surface 11b has a substantially S-shaped section changing from a downwardly convex curve to an upwardly convex curve perpendicularly toward the lower side, as shown in FIG. 1. Further, side surface portions close to the upper end 11a and the bottom surface 11c respectively are formed to be substantially perpendicular to the main surface of the semiconductor substrate 10.

According to the first embodiment, the trench 11 is so formed that the trench width of the upper end 11a is larger than that of the bottom surface 11c as described above, whereby the insulator 12 can be readily embedded in the trench 11. Thus, the insulator 12 can be prevented from defective embedding.

According to the first embodiment, further, the trench 11 is so formed that the length of the side surface located between the upper end 11a and the end of the bottom surface 11c is larger than the length of the shortest straight line connecting the upper end 11a and the end of the bottom surface 11c with each other, whereby the side surface located between the upper end 11a and the end of the bottom surface 11c can be rendered longer than a tapered side surface, for further improving the withstand voltage (dielectric strength) of the element isolation region. Thus, the trench 11 can be formed with an excellent element isolation characteristic.

When the side surface portion close to the bottom surface 11c is formed to be substantially perpendicular to the main surface of the semiconductor substrate 10 and increased in length, the depth of the trench 11 can be readily increased without changing the opening width. The depth of the trench 11 can be increased, whereby the withstand voltage (dielectric strength) of the element isolation region including the trench 11 can be readily adjusted. In this case, the withstand voltage is increased as the depth of the trench 11 is increased.

According to the first embodiment, further, the opening width of the trench 11 may not be changed as described above, whereby a mask employed for forming the trench 11 may not be changed either. Consequently, no cost is required for changing design of the withstand voltage.

A process of fabricating the semiconductor device according to the first embodiment is now described with reference to FIGS. 2 to 8.

Figure 2:
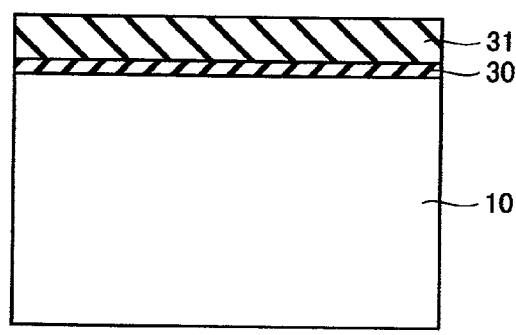
FIGS. 2 to 8 are sectional views for illustrating a fabrication process for the semiconductor device according to the first embodiment.

First, a silicon oxide film 30 and a silicon nitride film 31 are successively deposited on the semiconductor substrate 10, as shown in FIG. 2.

Figure 3:
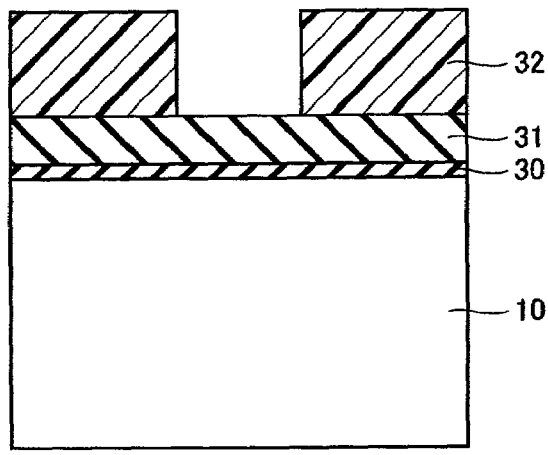

Then, a photoresist film (not shown) is formed on the overall surface of the silicon nitride film 31 and a trench opening is thereafter exposed and developed, thereby forming a resist film 32 having an opening pattern as shown in FIG. 3.

Figure 4:
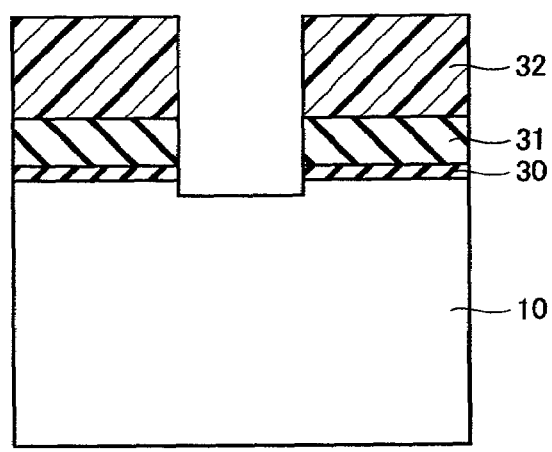
Figure 5:
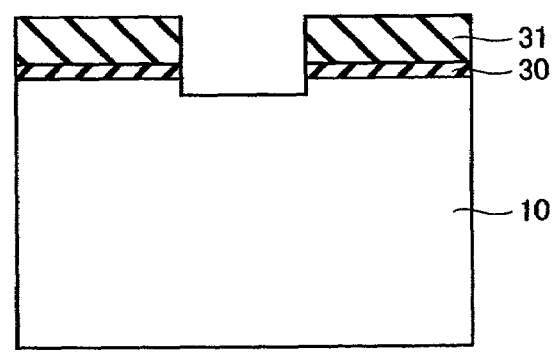

The resist film 32 is employed as a mask for anisotropically etching the silicon nitride film 31 and the silicon oxide film 30, as shown in FIG. 4. In this anisotropic etching of the silicon nitride film 31 and the silicon oxide film 30, the surface of the semiconductor substrate 10 is also etched. Thus, the silicon oxide film 30 can be reliably removed by etching. Thereafter the resist film 32 is removed by wet etching or ashing. Thus, the shape shown in FIG. 5 is obtained.

Figure 6:
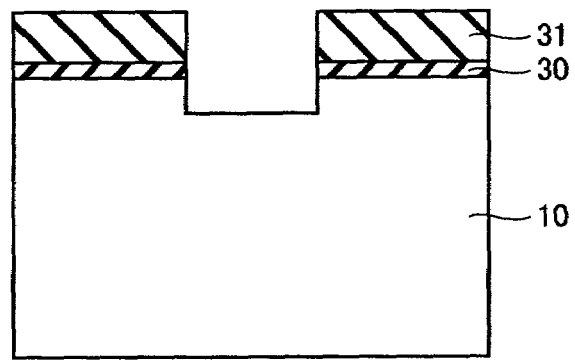
Figure 7:
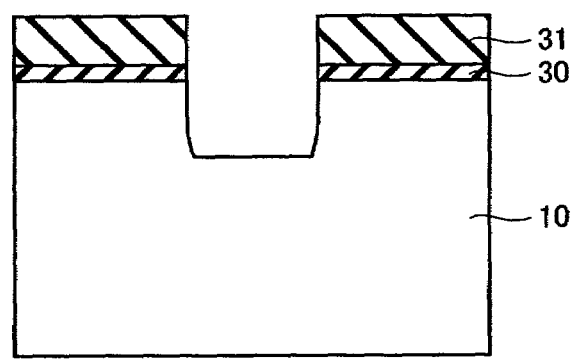
Figure 8:
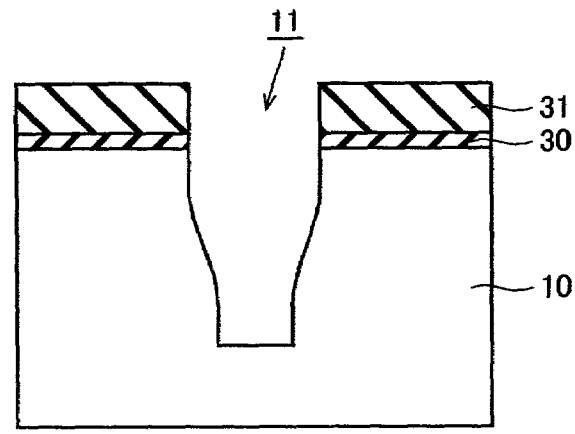

Then, the silicon nitride film 31 is employed as a mask for etching the semiconductor substrate 10 thereby forming the trench 11, as shown in FIGS. 6 to 8. This etching for forming the trench 11 is basically performed under conditions more readily forming sidewall protective films on the etched opening surface of the semiconductor substrate 10 than anisotropic etching conditions for perpendicularly etching the semiconductor substrate 10. Under such conditions for readily forming sidewall protective films, the trench 11 is generally readily formed in a tapered shape.

However, the first embodiment employs etching conditions reducing the reduction ratio as the trench width is reduced while self-controllably changing for substantially perpendicularly etching the semiconductor substrate 10.

Preferable ranges of the aforementioned etching conditions are as follows:
Pressure: 4.00 Pa to 6.65 Pa
Power: 350 W to 450 W (upper limit) and 50 W to 250 W (lower limit)
Substrate Temperature: 50° C. to 70° C.
Numerical Aperture: 50% to 60%
Trench Opening Width: 0.5 μm to 1.0 μm
Etching Gas: $O_2$ flow rate: 5 $cm^3$/min. to 15 $cm^3$/min. (in terms of standard state)
HBr and $Cl_2$ flow rate: 150 $cm^3$/min. to 200 $cm^3$/min. (in terms of standard state)
The ratio of $Cl_2$ in "HBr and $Cl_2$" is 0 to 20%.

In consideration of the aforementioned preferable ranges of the etching conditions, the following conditions are employed in the first embodiment:
Pressure: 4.0 Pa
Power: 400 W (upper limit) and 100 W (lower limit)
Substrate Temperature: 60° C.
Numerical Aperture: 55%
Trench Opening Width: 0.24 μm
Etching Gas: $O_2$ flow rate: 10 $cm^3$/min. (in terms of standard state)
HBr flow rate: 150 $cm^3$/min. (in terms of standard state)
$Cl_2$ flow rate: 30 $cm^3$/min. (in terms of standard state)

The trench 11 is formed in the order shown in FIGS. 6 to 8 by performing etching under the aforementioned conditions.

In the initial stage of etching, the semiconductor substrate 10 is substantially perpendicularly etched in a mode following the shape of the opening of the semiconductor substrate 10 perpendicularly etched in etching of the silicon oxide film 30, as shown in FIG. 6. As the trench formed by etching is deepened, the etching conditions approach those for forming a general tapered trench, as shown in FIG. 7. Thus, the trench width is gradually reduced. When the trench width is thus reduced, the reduction ratio is reduced as shown in FIG. 8, so that the etching conditions self-controllably change to the anisotropic etching conditions for substantially perpendicularly etching the semiconductor substrate 10. Thus, the trench 11 is formed in the shape shown in FIG. 8.

After formation of the trench 11, the silicon nitride film 31 and the silicon oxide film 30 are removed and the insulator 12 is thereafter embedded in the trench 11, as shown in FIG. 1. The element regions 21 and 22 are formed followed by formation of the interlayer dielectric film 23 and the wiring layers 24, thereby completing the semiconductor device according to the first embodiment.

In the fabrication process according to the first embodiment, the trench 11 is formed under self-controllable etching conditions as described above, whereby the trench 11 can be formed to be capable of preventing the insulator 12 from defective embedding with an excellent withstand voltage characteristic without artificially changing the etching conditions. Thus, the fabrication process can be simplified.

(Second Embodiment)

A semiconductor device according to a second embodiment of the present invention is now described with reference to FIG. 9. Elements of the semiconductor device according to the second embodiment common to those of the first embodiment are denoted by the same reference numerals. The semiconductor device according to the second embodiment is different from that according to the first embodiment only in the shape of a trench 111, while the remaining structure of the former is similar to that of the latter.

According to the second embodiment, the trench 111 is so formed that the trench width of a bottom surface is smaller than that of an upper end, similarly to the first embodiment. According to the second embodiment, further, side surface portions 111a and 111c of the trench 111 close to the upper end and the bottom end respectively are formed to be substantially perpendicular to a main surface of a semiconductor substrate 10. An inclined straight side surface portion 111b connects the side surface portions 111a and 111c close to the upper end and the bottom surface with each other.

Figure 9:
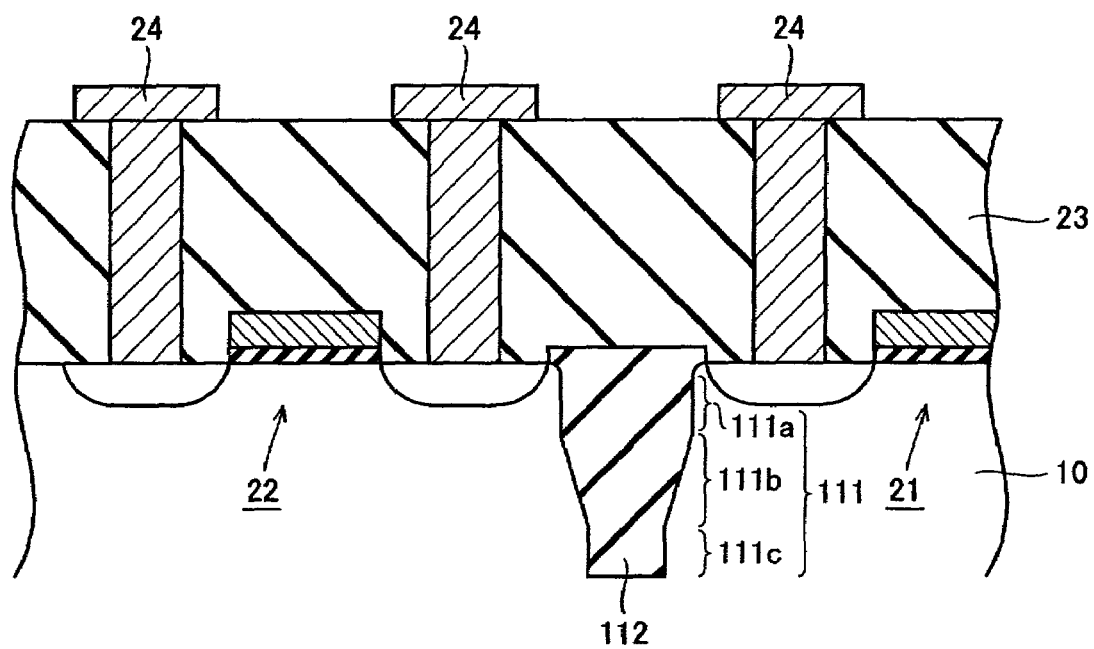
FIG. 9 is a sectional view showing a semiconductor device according to a second embodiment of the present invention.

Therefore, the section of the side surface of the trench 111 according to the second embodiment includes the straight side surface portion 111b connecting the side surface portions 111a and 111c close to the upper end and the bottom surface with each other with the minimum length, as shown in FIG. 9.

According to the second embodiment, the trench width of the bottom surface is set smaller than that of the upper end while the inclined straight side surface portion 111b is provided as described above, whereby an insulator 112 can be prevented from defective embedding in the trench 111.

According to the second embodiment, further, the side surface portions 111a and 111c close to the upper end and the bottom surface of the trench 111 are formed to be substantially perpendicular to the main surface of the semiconductor substrate 10, thereby increasing the length of the side surface beyond that of a tapered side surface. Thus, the withstand voltage of the trench 111 can be increased beyond that of a tapered trench. When the side surface portion 111c close to the bottom surface substantially perpendicular to the main surface of the semiconductor substrate 10 is increased in length, further, the depth of the trench 111 can be readily increased without increasing the trench width. Thus, the withstand voltage of an element isolation region including the trench 111 can be readily adjusted. In this case, the withstand voltage is increased as the depth of the trench 111 is increased.

In order to attain a withstand voltage of 2.5 V similarly to the aforementioned first embodiment, the lengths of the side surface portions 111a, 111b and 111c 111e along the direction perpendicular to the main surface of the semiconductor substrate 10 are preferably set to 20 to 40 nm, 150 to 300 nm and 50 to 150 nm respectively, while the depth of the trench 111 is preferably set to 300 to 400 nm.

A process of fabricating the semiconductor device according to the second embodiment is now described with reference to FIGS. 10 to 12.

In the fabrication process for the semiconductor device according to the second embodiment, a shape similar to that shown in FIG. 5 is obtained through steps similar to those in the fabrication process for the semiconductor device according to the first embodiment shown in FIGS. 2 to 5. Thereafter a silicon nitride film 31 is employed as a mask for anisotropically etching the semiconductor substrate 10 substantially perpendicularly to the main surface thereof, as shown in FIG. 10.

In this anisotropic etching of the semiconductor substrate 10, gas mainly composed of chlorine gas ($Cl_2$) is employed. Preferable ranges of etching conditions in this step are as follows:

Pressure: 4.66 Pa to 6.65 Pa
Power: 300 W to 600 W (upper limit) and 250 W to 350 W (lower limit)
Substrate Temperature: 20° C. to 60° C.
Etching Gas: $O_2$ flow rate: 5 cm$^3$/min. to 10 cm$^3$/min. (in terms of standard state)
$Cl_2$ flow rate: 100 cm$^3$/min. to 150 cm$^3$/min. (in terms of standard state)

In consideration of the aforementioned preferable ranges of the etching conditions, the etching conditions in this step are set as follows in the second embodiment:

Pressure: 5.32 Pa
Power: 300 W (upper limit) and 300 W (lower limit)
Substrate Temperature: 60° C.
Etching Gas: $O_2$ flow rate: 5 cm$^3$/min. (in terms of standard state)
$Cl_2$ flow rate: 100 cm$^3$/min. (in terms of standard state)

Figure 11:
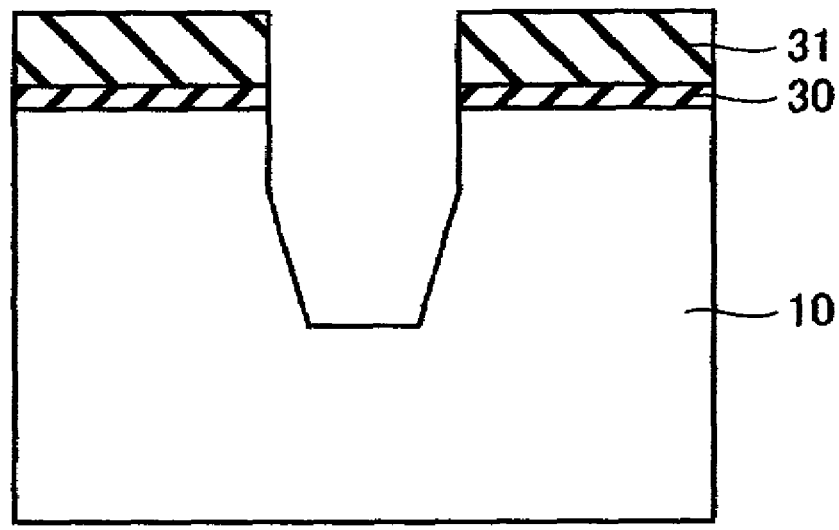

Then, the conditions are switched to those for etching the semiconductor substrate 10 in a tapered manner, for etching the semiconductor substrate 10 as shown in FIG. 11. In this step, etching gas mainly composed of hydrogen bromide (HBr) more readily reacting with silicon and forming a polymer than the aforementioned $Cl_2$ is employed. In other words, etching gas readily forming side wall protective films is employed. Preferable ranges of etching conditions in this step are as follows:

Pressure: 4.00 Pa to 6.65 Pa
Power: 350 W to 450 W (upper limit) and 50 W to 250 W (lower limit)
Substrate Temperature: 50° C. to 70° C.
Etching Gas: $O_2$ flow rate: 5 cm$^3$/min. to 15 cm$^3$/min. (in terms of standard state)
HBr and $Cl_2$ flow rate: 150 cm$^3$/min. to 200 cm$^3$/min. (in terms of standard state)
The ratio of HBr and $Cl_2$ is preferably 0 to 20%.

In consideration of the aforementioned preferable ranges of the etching conditions, the etching conditions in this step are set as follows in the second embodiment:

Pressure: 4.0 Pa
Power: 400 W (upper limit) and 100 W (lower limit)
Substrate Temperature: 60° C.
Etching Gas: $O_2$ flow rate: 10 cm$^3$/min. (in terms of standard state)
HBr flow rate: 150 cm$^3$/min. (in terms of standard state)
$Cl_2$ flow rate: 30 cm$^3$/min. (in terms of standard state)

Figure 12:
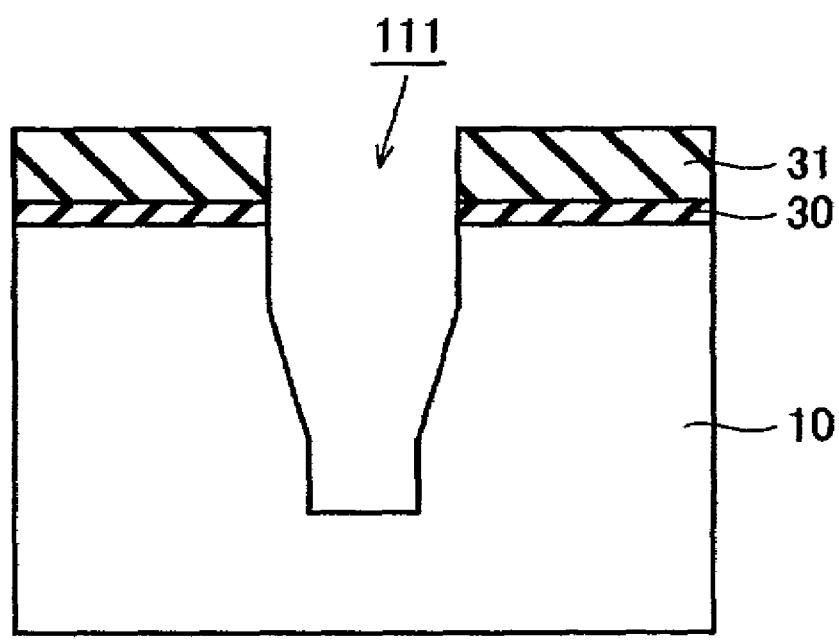

Thereafter the conditions are switched to the same conditions as the anisotropic etching conditions in the step shown in FIG. 10 again for etching the semiconductor substrate 10 thereby forming the trench 111, as shown in FIG. 12. Thereafter the silicon nitride film 31 and a silicon oxide film 30 are removed and the insulator 112 is embedded in the trench 111, as shown in FIG. 9. Element regions 21 and 22 are formed followed by formation of an interlayer dielectric film 23 and wiring layers 24, thereby completing the semiconductor device according to the second embodiment.

In the aforementioned fabrication process according to the second embodiment, the etching conditions are switched between those for anisotropic etching, etching for forming the trench 111 in a tapered manner and anisotropic etching, whereby the shape of the formed trench 111 can be properly controlled.

Although the present invention has been described and illustrated in detail, it is clearly understood that the same is by way of illustration and example only and is not to be taken by way of limitation, the spirit and scope of the present invention being limited only by the terms of the appended claims.

While the upper surface of the semiconductor substrate 10 is etched when the silicon nitride film 31 and the silicon oxide film 30 are etched in the step shown in FIG. 4 in the aforementioned first embodiment, for example, the present invention is not restricted to this but the upper surface of the semiconductor substrate 10 may not be etched when the silicon nitride film 31 and the silicon oxide film 30 are etched.

While each of the aforementioned embodiments requires the withstand voltage (dielectric strength) of 2.5 V to the element isolation region, the present invention is not restricted to this but also applicable to a case requiring another withstand voltage. In this case, the depth of the trench may be properly varied with the required withstand voltage. The depth of the trench can be readily controlled by adjusting the etching time.

Figure 10:
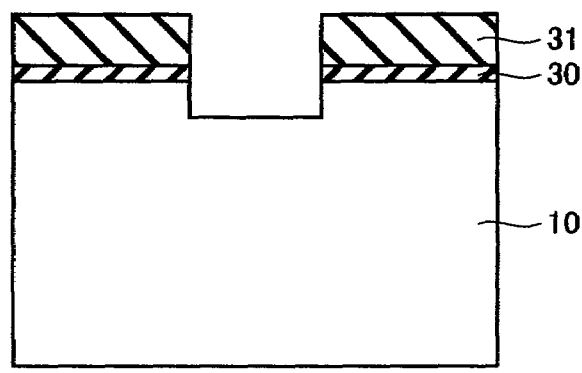
FIGS. 10 to 12 are sectional views for illustrating a fabrication process for the semiconductor device according to the second embodiment.

While the semiconductor substrate 10 is first perpendicularly anisotropically etched as shown in FIG. 10 in the aforementioned second embodiment, the present invention is not restricted to this but the step shown in FIG. 10 may be eliminated when a prescribed quantity of etching is already performed in the step similar to that shown in FIG. 4.

While the anisotropic etching conditions for perpendicularly etching the semiconductor substrate 10 and the conditions for etching the same in a tapered manner are specifically described with reference to the aforementioned second embodiment, the present invention is not restricted to these but other conditions may alternatively be employed.

While the side surface portions 111a and 111c close to the upper end and the bottom surface respectively are formed to be substantially perpendicular to the main surface of the semiconductor substrate 10 in the aforementioned second embodiment, the present invention is not restricted to this but other side surface portions may alternatively be formed to be substantially perpendicular to the main surface of the semiconductor substrate 10. For example, at least three side surface portions may be provided to be substantially perpendicular to the main surface of the semiconductor substrate 10, so that the opening widths of the side surface portions perpendicular to the main surface of the semiconductor substrate 10 are reduced toward the bottom surface.

What is claimed is:

1. A semiconductor device comprising:
    a semiconductor substrate having a main surface; and
    an element isolation trench formed on said main surface of said semiconductor substrate, said element isolation trench being substantially filled with an insulator, wherein
    the trench width of an upper end of said element isolation trench is larger than the trench width of a bottom surface while the length of a side surface located between said upper end and an end of said bottom surface is larger than the length of a straight line connecting said upper end and said end of said bottom surface, and said side surface of said element isolation trench includes:

a first side surface located in the vicinity of said upper end of said element isolation trench and formed to be substantially perpendicular to and extending downwardly from said main surface of said semiconductor substrate, a second side surface located in the vicinity of said bottom surface of said element isolation trench and formed to be substantially perpendicular to said main surface of said semiconductor substrate, and a substantially single, straight and linearly inclined third side surface directly connecting said first side surface and said second side surface with each other.

2. The semiconductor device according to claim 1, wherein the third side surface is linearly inclined with respect to the main surface of the semiconductor substrate.

3. A semiconductor device comprising:

a semiconductor substrate having a main surface; and an element isolation trench formed on said main surface of said semiconductor substrate, said element isolation trench being substantially filled with an insulator, wherein the trench width of an upper end of said element isolation trench is larger than the trench width of a bottom surface while the length of a side surface located between said upper end and an end of said bottom surface is larger than the length of a straight line connecting said upper end and said end of said bottom surface, and said side surface of said element isolation trench includes:

a first side surface located in the vicinity of said upper end of said element isolation trench and formed to be substantially perpendicular to and extending downwardly from said main surface of said semiconductor substrate, a second side surface located in the vicinity of said bottom surface of said element isolation trench and formed to be substantially perpendicular to said main surface of said semiconductor substrate, and a substantially inclined third side surface directly connecting said first side surface and said second side surface with each other, wherein the section of at least a central portion of said side surface of said element isolation trench exhibits a substantially curvilinear S shape having an angle of inclination gradually steepened toward a downward direction perpendicular to said main surface of said semiconductor substrate.

4. A semiconductor device comprising:

a semiconductor substrate having a main surface; and an element isolation trench formed on said main surface of said semiconductor substrate, said element isolation trench being substantially filled with an insulator, wherein the trench width of an upper end of said element isolation trench is larger than the trench width of a bottom surface, the trench comprising:

a first side surface located in the vicinity of said upper end of said element isolation trench and formed to be substantially perpendicular to and extending downwardly from said main surface of said semiconductor substrate, a second side surface located in the vicinity of said bottom surface of said element isolation trench and formed to be substantially perpendicular to said main surface of said semiconductor substrate, and a third side surface, directly connecting said first side surface and said second side surface with each other, which is substantially single, straight and linearly inclined with respect to the main surface or exhibits a substantially curvilinear S shape having an angle of inclination gradually steepened toward a downward direction perpendicular to said main surface of said semiconductor substrate.

* * * * *